United States Patent
Gotoh et al.

(10) Patent No.: US 7,073,443 B2
(45) Date of Patent: Jul. 11, 2006

(54) METHOD FOR PREPARING PROOF FOR PLATE PRINTING, AND RECORDING MEDIUM

(75) Inventors: Isao Gotoh, Tokyo (JP); Nobuyuki Yokota, Kanagawa (JP); Hiroyuki Fujii, Kanagawa (JP); Yasuo Yamada, Tokyo (JP); Motoi Kamba, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 73 days.

(21) Appl. No.: 10/369,667

(22) Filed: Feb. 21, 2003

(65) Prior Publication Data

US 2003/0148075 A1  Aug. 7, 2003

Related U.S. Application Data

(62) Division of application No. 09/832,898, filed on Apr. 12, 2001, now abandoned.

(30) Foreign Application Priority Data

Apr. 14, 2000 (JP) .............................. 2000-113848
Apr. 26, 2000 (JP) .............................. 2000-125167
Aug. 11, 2000 (JP) .............................. 2000-244949

(51) Int. Cl.
*B41C 1/54* (2006.01)
*B41J 3/407* (2006.01)

(52) U.S. Cl. ...................................... 101/483; 347/106

(58) Field of Classification Search ................ 428/195, 428/212, 500, 512; 347/105, 106; 101/483
See application file for complete search history.

(56) References Cited

U.S. PATENT DOCUMENTS

| | | | |
|---|---|---|---|
| 5,707,716 A | 1/1998 | Yoshino et al. | ............. 428/212 |
| 6,187,419 B1 | 2/2001 | Kijimuta et al. | |
| 6,238,047 B1 | 5/2001 | Suzuki et al. | |
| 6,352,330 B1 * | 3/2002 | Lubinsky et al. | ............. 347/15 |

FOREIGN PATENT DOCUMENTS

| | | |
|---|---|---|
| EP | 0 101 266 | 2/1984 |
| EP | 0 709 222 | 5/1996 |
| EP | 0 754 561 | 1/1997 |
| JP | 08 027693 | 1/1996 |
| JP | 2000326623 A * | 11/2000 |
| WO | WO 98/47718 | 10/1998 |

* cited by examiner

*Primary Examiner*—Ren Yan
(74) *Attorney, Agent, or Firm*—Oblon, Spivak, McClelland, Maier & Neustadt, P.C.

(57) ABSTRACT

A method for preparing a proof for plate printing, which comprises applying inkjet printing to an ink receiving layer of a recording medium having the ink receiving layer formed on the surface of a support made of plate printing paper for regular printing or made of paper having substantially the same brightness and glossiness as such plate printing paper, to obtain a printing proof.

8 Claims, No Drawings

METHOD FOR PREPARING PROOF FOR PLATE PRINTING, AND RECORDING MEDIUM

This application is a divisional application of U.S. application Ser. No. 09/832,898 filed on Apr. 12, 2001, now abandoned.

The present invention relates to a method for preparing a proof for plate printing by ink jet printing and a recording medium for a plate printing proof.

In the plate printing operation to obtain a very large amount of printed matters, it is common to carry out proof printing to see if letters, colors, layout, arrangement, etc. are as designed, prior to carrying out actual printing (hereinafter referred to as regular printing). The printed matter obtained by this proof printing is a so-called proof. The preparation of this proof used to be carried out by spending a substantial cost by a method similar to regular printing. However, in recent years, along with the progress in electronics, there have been needs in the market for preparation of a proof directly from digital data to reduce the cost or for a reason such that changes can easily be made. To comply with such needs in the market, it has been proposed to prepare a proof directly from digital data by means of various printers of e.g. a sublimation type thermal transfer system, an ink jet system or a melting type thermal transfer system. The ink jet system is one to eject ink droplets from a nozzle towards a recording medium at a high speed and has merits in that the apparatus is relatively small in size, and the running cost is low. In addition, with a printer of an ink jet system, full color printing or high speed printing will be easy, and the printing noise is small. Accordingly, this is one of prospective methods for the preparation of the proof.

On the other hand, for such a proof, as compared with printed matters obtainable by regular printing (hereinafter referred to as regular printed matters) by various plate printing such as gravure printing, offset printing and relief printing, substantially the same levels are desired with respect to the overall textures such as reproduction of a wide range of colors, presentation of half tones, glossiness, sizzling appearance, metallic appearance and color fogging.

However, when a proof is to be prepared by the above-mentioned ink jet system, if ink jet printing is carried out on plain paper, or if ink jet printing is carried out on printing paper to be used for regular printing, a defect such as flooding or running of ink will result, and a satisfactory proof can not be obtained. Further, if ink jet printing is carried out on a usual ink jet printing paper, the texture represented by e.g. a hue or glossiness is substantially different from the viewpoint of the similarity to regular printed matters. Therefore, heretofore, the purpose of proofing the regular printed matters has not sufficiently been accomplished.

It is an object of the present invention to provide a proof which not only is equal to a regular printed matter with respect to reproduction of colors, presentation of half tones and glossiness but also resembles a regular printed matter with respect to overall textures such as sizzling appearance, metallic appearance and color fogging, and to provide a method for preparing a proof for plate printing by an ink jet system.

The present invention provides a method for preparing a proof for plate printing, which comprises applying inkjet printing to an ink receiving layer of a recording medium having the ink receiving layer formed on the surface of a support made of plate printing paper for regular printing or made of paper having substantially the same brightness and glossiness as such plate printing paper, to obtain a printing proof.

As a result of a research by the present inventors, it has been found that in a case where a proof for plate printing is to be prepared by an ink jet system, when the same plate printing paper as used for regular printing, is used, an excellent proof for plate printing can be obtained by forming an ink receiving layer on its surface.

Further, it has been found that in the present invention, it is not necessarily required to use the same printing paper as used for regular printing, i.e. substantially the same excellent proof for printing can be obtained also in a case where paper having substantially the same brightness and glossiness as such regular printing paper, is used. This is based on a discovery that the difference in the texture between the regular printed matter and the proof printed matter is governed mainly by such brightness and glossiness, and this is economically advantageous when the regular plate printing paper for a large size product or works of art is an expensive material.

Now, the present invention will be described in detail with reference to the preferred embodiments.

In the present invention, as the support of the recording medium (hereinafter referred to as the recording medium of the present invention) to be used for the preparation of a proof for plate printing, most preferably, plate printing paper to be used for regular printing, is employed. In such a case, a proof equal to a regular printed matter can be obtained not only with respect to the image quality to be formed on the surface but also with respect to the thickness, stiffness, etc., of the paper, such being preferred. However, from the viewpoint of the image quality, when a support made of paper having substantially the same brightness and glossiness as printing paper to be used for regular printing, is used, a proof very close to a regular printed matter, can be obtained. Here, "substantially the same" means that when regular printing paper and the support are compared, the difference in brightness is preferably at most 10%, particularly preferably at most 5%, based on the regular printing, and the difference in glossiness (60°) is preferably at most 20%, particularly preferably at most 15%, based on the regular printing paper.

In the present invention, plate printing is a printing by means of printing plate, preferably by printing press. Plate printing may be such as offset printing, gravure printing or relief printing. Such plate printing paper is classified into non-coated printing paper and coated printing paper. The non-coated printing paper may, for example, be printing paper A (using 100% chemical pulp, so-called high quality paper), printing paper B (using at least 70% of chemical pulp, so-called medium quality paper), printing paper C (using at least 40% and less than 70% of chemical pulp, so-called low grade paper), printing paper D (using less than 40% of chemical pulp), gravure paper or senkashi. The coated printing paper is classified into light weight coat paper (double-sided coating amount: 15 to 20 g/m$^2$), coated paper (double-sided coating amount: 20 to 30 g/m$^2$) and art paper (double-sided coating amount: 40 to 50 g/m$^2$). Depending upon the glossiness, each type is further classified into mat, dull and gloss. Further, coated printing papers may, for example, be cast coat paper and embossed paper.

In the present invention, in a case where a support made of paper having substantially the same brightness and glossiness as such plate printing paper, is used without using plate printing paper for regular printing, if a proof close to a printed matter by regular printing (hereinafter referred to as regular printed matter) including thickness, stiffness, etc. in addition to the image reproducibility, is desired, it is preferred to use one close to regular printing paper with respect to these aspects. Thus, in a case where plate printing paper for regular printing is paper, a support made of natural paper containing pulp as the main component, is preferably used, and in a case where plate printing paper is synthetic paper such as plastic film, a support made of e.g. plastic film, is preferably used.

For regular printing paper, a suitable ink receiving layer may be a porous layer (hereinafter referred to as a porous ink receiving layer) comprising a pigment and a binder or a layer containing a water-soluble resin in an amount of at least 80 mass % (hereinafter referred to as a swelling ink receiving layer).

In a case where the ink receiving layer is a porous layer, the pore characteristics are preferably such that the average pore radius is from 3 to 25 nm, more preferably from 5 to 15 nm, and the pore volume is preferably from 0.3 to 2.0 $cm^3/g$, more preferably from 0.5 to 1.5 $cm^3/g$. If the average pore radius and the pore volume are outside the above ranges, the ink absorptivity tends to be poor, or transparency of the ink receiving layer tends to be low, whereby the texture will be impaired, such being undesirable.

In the recording medium of the present invention, the pigment to be used for the formation of the ink receiving layer is preferably such that a pigment preferably having an average particle diameter of at most 1 μm, is contained in an amount of at least 50%, preferably at least 80%, of the total solid content in the ink receiving layer. As an inorganic pigment, preferably, silica, alumina, aluminosilicate, zeolite, monmorillite group minerals, beidellite group minerals, saponite group minerals, hectorite group minerals, stevensite group minerals, hydrotalcite group minerals, smectite group minerals, bentonite group minerals, calcium carbonate, magnesium carbonate, calcium sulfate, barium sulfate, titanium oxide, zinc oxide, zinc carbonate, aluminum silicate, calcium silicate, magnesium silicate, kaolin or talc, may be mentioned. As an organic pigment, a plastic pigment, a urea resin pigment, cellulose particles or starch particles, may be mentioned. These pigments may be used in combination as a mixture of two or more of them.

Among them, the pigment is preferably an inorganic pigment. Specifically, preferred is, for example, silica, alumina, alumina hydrate, or a mixture or complex thereof. Further, as a silica type pigment, colloidal silica, synthetic fine powder silica or gas phase synthetic silica may be exemplified. As an alumina type pigment, alumna, boehmite, alumina hydroxide or polyaluminum chloride, may, for example, be mentioned. Among them, alumina hydrate is preferred since it absorbs and fixes ink well. Particularly preferred is boehmite ($Al_2O_3 \cdot nH_2O$, n=1 to 1.5). As the alumina hydrate, various types may be employed, but it is preferred to employ sol-type boehmite as the raw material, since it is thereby possible to readily obtain a flat and smooth layer.

In the porous layer, together with alumina or silica, various other pigments may be used in combination for the brightness and glossiness of the ink receiving layer to be formed, or to adjust the smoothness and hue, as the case requires. For example, an inorganic pigment such as clay, kaolin, precipitated calcium carbonate light, calcium carbonate heavy, talc or satin white, or an organic pigment such as a pigment of a urea resin type, a melamine resin type, a styrene type or an acryl type, may be mentioned.

As the binder to be used for forming the porous ink receiving layer, a water-soluble polymer, an alcohol-soluble polymer or a mixture thereof, may be employed, such as starch or its modified product, polyvinyl alcohol or its modified product, a styrene/butadiene rubber latex, a nitrile/butadiene rubber latex, methyl cellulose, hydroxy cellulose, hydroxy methyl cellulose, carboxy methyl cellulose, gelatin, polyvinyl pyrrolidone, polyacrylic acid or polyacryl amide. Among them, in the present invention, it is preferred to use polyvinyl alcohol or its modified product, since the ink absorptivity and water resistance are excellent. The binder is incorporated preferably in an amount of from 1 to 30 parts by mass, particularly from 3 to 15 parts by mass, per 100 parts by mass of the above-described pigment in the ink receiving layer.

The swelling ink receiving layer contains a water-soluble polymer in an amount of at least 80 mass % in the ink receiving layer.

The water-soluble polymer may, for example, be a completely saponified or partially saponified polyvinyl alcohol, modified polyvinyl alcohol, an ethylene-vinyl alcohol copolymer, polyvinyl pyrrolidone, polyalkylene oxide, gelatin, modified gelatin, starch, modified starch, casein, soybean casein, modified soybean casein, a cellulose derivative (such as methyl cellulose, ethyl cellulose, carboxy methyl cellulose, hydroxy ethyl cellulose, hydroxy propyl cellulose, hydroxy propyl methyl cellulose or nitro cellulose). One or more of these resins may be suitably selected for use.

In the present invention, a pigment may be incorporated to the ink receiving layer, as the case requires. As such a pigment, a synthetic or natural inorganic or organic pigment may be used alone or in combination of two or more of such pigments. The inorganic pigment may, for example, be a carbonate, a sulfate, an oxide or a silicate.

In the present invention, the thickness of the ink receiving layer to be formed on the support is suitably selected depending upon the ink absorptivity, the strength of the coating layer, the particular purpose, etc. However, preferably, a thickness of from 1 to 100 μm is employed. If the thickness is less than 1 μm, ink absorptivity of the ink receiving layer tends to be inadequate. On the other hand, if it exceeds 100 μm, the transparency or strength of the ink receiving layer tends to deteriorate, such being undesirable.

The ink receiving layer preferably has a thickness of from 5 to 100 μm and a haze of at most 40%. If the thickness is less than 5 μm, the effect as the ink receiving layer tends to be hardly obtainable, and if it exceeds 100 μm, the haze tends to be large, and the transparency or strength tends to deteriorate, such being undesirable. Particularly preferably, the thickness of the ink receiving layer is from 10 to 50 μm.

In the present invention, the haze is determined in such a manner that on a transparent film of polyethylene terephthalate, the same ink receiving layer as in the recording medium is formed, and from the value measured by a haze meter, the haze of the above transparent film itself is deducted to obtain the haze. In the present invention, if the haze of the ink receiving layer exceeds 40%, the color density tends to be low, whereby the object of the present invention may not be accomplished. Within the above range, the haze is more preferably at most 20%.

The recording medium of the present invention preferably has a color difference ($\Delta E$) of at most 5.0 and a difference in glossiness (60°) of at most 30%, as between the sheet prior to forming the ink receiving layer and the recording medium after forming the ink receiving layer. If the color difference exceeds 5.0 or if the difference in glossiness exceeds 30%, the texture of the resulting proof will be different as compared with a regular printed matter, irrespective of whether the difference is large or small. It is particularly preferred that the color difference and the difference in glossiness are at most 3.0 and at most 15%, respectively.

It has been found that with the recording medium having an ink receiving layer on its surface, obtained as described above, it is preferred that as compared with printing paper to be used for regular printing, the difference in brightness is preferably at most 10%, particularly preferably at most 5%, and the difference in glossiness (60°) is preferably at most 40%, particularly preferably at most 15%, at the surface of the ink receiving layer, in order to obtain a good proof having a texture not so different as compared with a regular printed matter.

Further, in the present invention, the recording medium to be used for the preparation of the proof may have the ink receiving layer formed on one side thereof. However, in some cases, the same ink receiving layer may be formed also on the other side, or a rear side layer containing a different pigment or binder may be formed, for example, for the purpose of preventing curling.

With the recording medium having an ink receiving layer on its surface, thus prepared, in the present invention, ink jet printing is applied to the ink receiving layer side of the recording medium to obtain a printing proof. In this case, as the ink jet printing method, a conventional system may be employed.

As a method for forming an ink receiving layer on the support, a method may, for example, be employed wherein a binder is added to a pigment to obtain a slurry, which is coated by means of a roll coater, an air knife coater, a blade coater, a rod coater, a bar coater, a comma coater, a gravure coater, a die coater, a curtain coater or a spray coater, followed by drying.

The surface of the ink receiving layer of the recording medium thus formed, may be subjected to calendering treatment to impart gloss. Such calendering treatment may be carried out by using an apparatus such as a super calender or a gloss calender and passing the medium between rolls preferably at a temperature of from 0 to 160°C., particularly preferably from 30 to 100°C., under a pressure of preferably from 50 to 400 kN/m, particularly preferably from 100 to 250 kN/m. Further, such gloss may be imparted also by so-called cast coating wherein when an ink receiving layer is formed, the ink receiving layer is dried and released in such a state that its surface is in contact with a flat and smooth mold surface.

Now, the present invention will be described in further detail with reference to Examples. However, it should be understood that the present invention is by no means restricted to such specific Examples. In the following, Examples 1 to 22 represent Working Examples of the present invention, and Example 23 represents a Comparative Example. Further, in the Examples, "parts" means "parts by mass" unless otherwise specified.

EXAMPLE 1

On the surface on one side of a gloss type coated paper (OK Top Coat N, tradename, manufactured by Oji Paper Co., Ltd.) having a weight of 127.9 g/m² i.e. the same paper as used for offset printing, the following ink receiving layer formulation 1 was coated by means of a bar coater so that the thickness of the coating layer after drying would be 15 μm, and dried at 120°C. Thus, an ink jet recording medium having an ink receiving layer having an average pore radius of 11 nm and a pore volume of 0.8 cm³/g, was obtained.

Ink Receiving Layer Formulation 1
  Alumina sol (one obtained by deflocculating a slurry obtained by reacting aluminum chloride with sodium aluminate and having a concentration of 20%): 100 parts
  Polyvinyl alcohol (PVA-124, tradename, manufactured by Kuraray Co., Ltd.): 10 parts Using an ink jet printer (PM-5000C. tradename, manufactured by Seiko Epson K.K.), a color chart was printed on the obtained sheet to obtain a printing proof.

On the other hand, the same color chart was printed by an offset printing machine on a gloss type coated paper having no ink receiving layer formed, to obtain a printed product.

EXAMPLE 2

In Example 1, the sheet product prior to ink jet printing was passed between a metal roll and an elastic roll press-contacted at a linear pressure of 200 kN/m to apply calender treatment. On this sheet product, ink jet printing was applied in the same manner as in Example 1 to obtain a printing proof.

EXAMPLE 3

A sheet product was obtained in the same manner as in Example 1 except that the following ink receiving layer formulation 2 was used as the ink receiving layer formulation. To this sheet product, ink jet printing was applied in the same manner as in Example 1 to obtain a printing proof.

On the other hand, for regular printing, on the same gloss type coated paper as used in Example 1, the same color chart was printed by an offset printer to obtain a regular printed product.

Ink Receiving Layer Formulation 2
  Silica sol (Snowtex UP, tradename, manufactured by Nissan Chemical Industries): 100 parts
  Polyvinyl alcohol (R-1130, tradename, manufactured by Kuraray Co., Ltd.): 10 parts

EXAMPLE 4

In the same manner as in Example 1 except that a gloss type art paper having a weight of 127.9 g/m² (OK Kanafuji N, tradename, manufactured by Oji Paper Co., Ltd.) was used as the support, a recording medium was obtained. To such a recording medium, ink jet printing was applied in the same manner as in Example 1 to obtain a printing proof.

On the other hand, on the above gloss type art paper having no ink receiving layer formed, the same color chart was printed by a gravure printer to obtain a regular printed product.

EXAMPLE 5

In the same manner as in Example 1 except that a mat type coated paper having a weight of 127.9 g/m² (New Age, tradename, manufactured by Oji Paper Co., Ltd.) was used as the support, and the following ink receiving layer formulation 3 was used as the ink receiving layer formulation, a recording medium was obtained. To such a recording medium, ink jet printing was applied in the same manner as in Example 1 to obtain a printing proof.

Ink Receiving Layer Formulation 3
  Alumina sol (Kataroide AS-3, tradename, manufactured by Catalysts & Chemicals Industries Co., Ltd.): 90 parts
  Amorphous silica (P78A, tradename, manufactured by Mizusawa Industrial Chemicals, Ltd.): 10 parts
  Polyvinyl alcohol. (PVA-12, tradename, manufactured by Kuraray Co., Ltd.): 10 parts On the other hand, on the above mat type coated paper having no ink receiving layer formed, a color chart was printed by a relief printer to obtain a regular printed product.

EXAMPLE 6

In the same manner as in Example 1 except that a dull type art paper having a weight of 127.9 g/m² (Satin Kanafuji N, tradename, manufactured by Oji Paper Co., Ltd.) was used as the support, and the above-mentioned ink receiving layer formulation 3 was used as the ink receiving layer formulation, a recording medium was obtained. To such a recording medium, ink jet printing was applied to obtain a printing proof.

On the other hand, on the above dull type art paper having no ink receiving layer formed, the same color chart was printed by an offset printer to obtain a regular printed product.

EXAMPLE 7

In the same manner as in Example 1 except that printing paper A having a weight of 127.9 g/m² (OK Prince High Quality, tradename, manufactured by Oji Paper Co., Ltd.) was used as the support, and the above-mentioned ink receiving layer formulation 3 was used as the ink receiving layer formulation, a recording medium was obtained. To such a recording medium, ink jet printing was applied to obtain a printing proof.

On the other hand, on the above-mentioned printing paper A having no ink receiving layer formed, the same color chart was printed by an offset printer to obtain a regular printed product.

EXAMPLE 8

In the same manner as in Example 1 except that a gloss type coated paper having a weight of 127.9 g/m² (OK Coat V, tradename, manufactured by Oji Paper Co., Ltd., as compared with the gloss type coated paper to be used in the following regular printing, the brightness is larger by 1.0%, and the glossiness is smaller by 14.0%) was used as the support, a recording medium having an ink-receiving layer on its surface, was obtained. To such a recording medium, ink jet printing was applied in the same manner as in Example 1 to obtain a printing proof.

On the other hand, for regular printing, on the same gloss type coated paper as used in Example 1, the same color chart was printed by a gravure printer to obtain a regular printed product.

EXAMPLE 9

In the same manner as in Example 5 except that a mat type coated paper having a weight of 127.9 g/m² (OK Top Coat Mat, tradename, manufactured by Oji Paper Co., Ltd., as compared with the mat type coated paper to be used in the following regular printing, the brightness is larger by 3.0%, but the glossiness is the same) was used as the support, a recording medium having an ink-receiving layer on its surface, was obtained. To such a recording medium, ink jet printing was applied in the same manner as in Example 5 to obtain a printing proof.

On the other hand, for regular printing, on the same mat type coated paper as used in Example 5, the same color chart was printed by a relief printer to obtain a regular printed product.

EXAMPLE 10

In the same manner as in Example 1 except that the following ink receiving layer formulation 4 was used as the ink receiving layer formulation, a recording medium was obtained. To such a recording medium, ink jet printing was applied in the same manner as in Example 1 to obtain a printing proof.

A regular printed product was the same as in Example 1.

Ink Receiving Layer Formulation 4
  Alumina sol (Kataroide AS-3, tradename, manufactured by Catalysts & Chemicals Industries Co., Ltd.): 50 parts
  Amorphous silica (P78A, tradename, manufactured by Mizusawa Industrial Chemicals, Ltd.): 50 parts
  Polyvinyl alcohol (PVA-124, tradename, manufactured by Kuraray Co., Ltd.): 10 parts

EXAMPLE 11

In the same manner as in Example 1 except that the following ink receiving layer formulation 5 was used as the ink receiving layer formulation, a recording medium was obtained. To such a-recording medium, ink jet printing was applied in the same manner as in Example 1 to obtain a printing proof.

A regular printed product was the same as in Example 1.

Ink Receiving Layer Formulation 5
  Amorphous silica (P78A, tradename, manufactured by Mizusawa Industrial Chemicals, Ltd.): 100 parts
  Polyvinyl alcohol (R1130, tradename, manufactured by Kuraray Co., Ltd.): 40 parts

EXAMPLE 12

In the same manner as in Example 1 except that the ink receiving layer formulation 1 was used as the ink receiving layer formulation, and the thickness of the coated layer after drying was 4 µm instead of 15 µm, a recording medium was obtained. To this recording medium, ink jet printing was applied in the same manner as in Example 1 to obtain a printing proof.

A regular printed product was the same as in Example 1.

EXAMPLE 13

On the surface on one side of a gloss type coated paper having a weight of 127.9 g/m² (OK Top Coat N, tradename, manufactured by Oji Paper Co., Ltd.) i.e. the same paper as used for regular printing by offset printing, the following ink receiving layer formulation 6 was coated by means of a bar coater so that the thickness of the coating layer after drying would be 15 µm, and dried at 120°C. to obtain a recording medium having an ink receiving layer.

Ink Receiving Layer Formulation 6
A coating fluid obtained by mixing 100 parts of methyl cellulose (Metorose SM15, tradename, manufactured by Shin-Etsu Chemical Co., Ltd.) and 1 part of amorphous silica (Silysia 370, tradename, manufactured by Fuji Silysia Chemical Ltd.)

On the obtained recording medium, a color chart was printed using an ink jet printer (PM-5000C, tradename, manufactured by Seiko Epson K.K.) to obtain a proof.

On the other hand, on the above-mentioned gloss type coated paper having no ink receiving layer formed, the same color chart was printed by an offset printer to obtain a regular printed product.

EXAMPLE 14

In Example 13, the recording medium prior to ink jet printing, was passed through a metal roll and an elastic roll contacted under a linear pressure of 200 kN/m to is apply calendering treatment. To this recording medium having calender treatment applied, ink jet printing was applied in the same manner as in Example 13 to obtain a proof.

A regular printed product was the same as in Example 13.

EXAMPLE 15

In the same manner as in Example 13 except that the following ink receiving layer formulation 7 was used as the ink receiving layer formulation, a recording medium was obtained. To this recording medium, ink jet printing was applied in the same manner as in Example 1 to obtain a printing proof.

A regular printed product was the same as in Example 13.

Ink Receiving Layer Formulation 7
Methyl cellulose (Metorose SM15, tradename, manufactured by Shin-Etsu Chemical Co., Ltd.): 100 parts
Amorphous silica (Silysia 370, tradename, manufactured by Fuji Silysia Chemical Ltd.): 10 parts

EXAMPLE 16

In the same manner as in Example 13 except that the following ink receiving layer formulation 8 was used as the ink receiving layer formulation, a recording medium was obtained. To this recording medium, ink jet printing was applied in the same manner as in Example 13 to obtain a proof.

A regular printed product was the same as in Example 13.

Ink Receiving Layer Formulation 8
A coating fluid obtained by mixing 100 parts of polyvinyl alcohol (Gosenol NM-14, tradename, manufactured by Nippon Gosei Kagaku K.K.) and 1 part of amorphous silica (Silysia 370, tradename, manufactured by Fuji Silysia Chemical Ltd.)

EXAMPLE 17

In the same manner as in Example 13 except that a gloss type art paper having a weight of 127.9 g/m² (OK Kanafuji N, tradename, manufactured by Oji Paper Co., Ltd.) was used as the support, a recording medium was obtained. To this recording medium, ink jet printing was applied in the same manner as in Example 13 to obtain a proof.

On the other hand, on the above gloss type art paper having no ink receiving layer formed, the same color chart was printed by a gravure printer to obtain a regular printed product.

EXAMPLE 18

In the same manner as in Example 13 except that a mat type coated paper having a weight of 127.9 g/m² (New Age, tradename, manufactured by Oji Paper Co., Ltd.) was used as the support, and the following ink receiving layer forming formulation 9 was used as the ink receiving layer forming coating fluid, a recording medium was obtained. To this recording medium, ink jet printing was applied in the same manner as in Example 13 to obtain a proof.

On the other hand, on the above-mentioned mat type coated paper having no ink receiving layer formed, the same color chart was printed by a relief printer to obtain a regular printed product.

Ink Receiving Layer Formulation 9
A coating fluid obtained by mixing 100 parts of methyl cellulose (Metorose SM15, tradename, manufactured by Shin-Etsu Chemical Co., Ltd.) and 15 part of amorphous silica (Silysia 370, tradename, manufactured by Fuji Silysia Chemical Ltd.)

EXAMPLE 19

In the same manner as in Example 13 except that a dull type art paper having a weight of 127.9 g/m² (Satin Kanafuji N, tradename, manufactured by Oji Paper Co., Ltd.) was used as the support, and the above-mentioned ink receiving layer forming formulation 9 was used as the ink receiving layer forming formulation, a recording medium was obtained. To this recording medium, ink jet printing was applied in the same manner as in Example 1 to obtain a proof.

On the other hand, on the above-mentioned dull type art paper having no ink receiving layer formed, the same color chart was printed by an offset printer to obtain a regular printed product.

EXAMPLE 20

In the same manner as in Example 13 except that printing paper A having a weight of 127.9 g/m² (OK Prince High Quality, tradename, manufactured by Oji Paper Co., Ltd.) was used as the support, and the above-mentioned ink receiving layer forming formulation 9 was used as the ink receiving layer forming fluid, a recording medium was obtained. To this recording medium, ink jet printing was applied in the same manner as in Example 13 to obtain a proof.

On the other hand, on the above-mentioned printing paper A having no ink receiving layer formed, the same color chart was printed by an offset printer to obtain a regular printed product.

EXAMPLE 21

In the same manner as in Example 13 except that a gloss type coated paper having a weight of 127.9 g/m² (OK Coat V, tradename, manufactured by Oji Paper Co., Ltd., as compared with the gloss type coated paper to be used in the following regular printing, the brightness is larger by 1.0%, and the glossiness is smaller by 14.0%), a recording medium was obtained. To this recording medium, ink jet printing was applied in the same manner as in Example 13 to obtain a proof.

On the other hand, for regular printing, on the same gloss type coated paper as used in Example 13, the same color chart was printed by a gravure printer to obtain a regular printed product.

EXAMPLE 22

In the same manner as in Example 5 except that a mat type coated paper having a weight of 127.9 g/m² (OK Top Coat Mat, tradename, manufactured by Oji Paper Co., Ltd., as compared with the mat type coated paper to be used in the following regular printing, the brightness is larger by 3.0%, but the glossiness was the same), a recording medium was obtained. To this recording medium, ink jet printing was applied in the same manner as in Example 18 to obtain a proof.

On the other hand, for regular printing, on the same mat type coated paper as used in Example 18, the same color chart was printed by a relief printer to obtain a regular printed product.

EXAMPLE 23

In Example 1, on the surface of a gloss type coated paper (OK Top Coat N, tradename, manufactured by Oji Paper Co., Ltd.) as the support, it was attempted to apply ink jet printing in the same manner as in Example 1 without forming an ink receiving layer, but the ink absorptivity was poor, only an unclear image was obtained, and no practical usefulness as a proof was obtained.

Evaluation 1

Using recording media of the above Examples 1 to 23, proofs for plate printing were prepared by ink jet printing and compared with regular printed products. Table 1 is one wherein the regular printed product and the proof are compared by optical characteristics (glossiness and brightness) at a white color portion of an image of S6A of color chart ISO/JIS-SCID i.e. at the portion where no ink was deposited. Here, Example 23 was inadequate with respect to the printing performance and thus was not suitable as a proof. Accordingly, it was not presented in Table 1.

TABLE 1

| Example No. | Glossiness | | Brightness | |
|---|---|---|---|---|
| | Regular printing | Proof | Regular printing | Proof |
| 1 | 36.0 | 36.5 | 85.3 | 85.1 |
| 2 | 36.0 | 44.3 | 85.3 | 85.4 |
| 3 | 36.0 | 38.5 | 85.3 | 85.5 |
| 4 | 42.5 | 44.0 | 86.0 | 85.5 |
| 5 | 6.5 | 8.0 | 83.0 | 82.4 |
| 6 | 6.5 | 8.8 | 87.3 | 86.5 |
| 7 | 4.5 | 8.2 | 80.6 | 80.8 |
| 8 | 36.0 | 23.8 | 85.3 | 85.9 |
| 9 | 6.5 | 8.3 | 83.0 | 85.6 |
| 10 | 36.0 | 7.5 | 85.3 | 86.4 |
| 11 | 36.0 | 3.1 | 85.3 | 89.0 |
| 12 | 36.0 | 36.1 | 85.3 | 85.2 |
| 13 | 36.0 | 41.2 | 85.4 | 83.6 |
| 14 | 36.0 | 47.5 | 85.4 | 83.2 |
| 15 | 36.0 | 32.4 | 85.3 | 85.7 |
| 16 | 36.0 | 41.9 | 85.4 | 84.3 |
| 17 | 39.3 | 38.8 | 86.0 | 85.1 |
| 18 | 4.3 | 7.9 | 83.2 | 82.6 |

TABLE 1-continued

| Example No. | Glossiness | | Brightness | |
|---|---|---|---|---|
| | Regular printing | Proof | Regular printing | Proof |
| 19 | 6.2 | 8.9 | 87.4 | 85.1 |
| 20 | 4.9 | 6.6 | 79.3 | 79.6 |
| 21 | 36.0 | 28.5 | 85.4 | 84.3 |
| 22 | 4.3 | 8.2 | 83.2 | 81.9 |

From Table 1, it is evident that the regular printed product by plate printing and the proof have substantially the same optical characteristics at the respective white color portions, and they have similar textures. Further, the proofs by ink jet printing of Examples 1 to 22, had no substantial difference in the overall textures such as reproduction of colors, presentation of half tones, glossiness, sizzling appearance, metallic appearance and color fogging as compared with the regular printed products, and they were sufficient as proofs.

Evaluation 2

With respect to the recording media for proofs in Examples 1, 3, 5, 10, 11, 12, 15 and 16, the haze degrees of the ink receiving layers were measured by the above-described method. Further, the color difference and the difference in glossiness as between before and after formation of the ink-receiving layer, were measured as described below. These results are shown in Table 2.

Color Difference

The hue (L1*a1*b1*) of the support before coating the ink receiving layer and the hue (L2*a2*b2*) after the coating were measured by using a color difference meter (SPM100-2, tradename, manufactured by GRETAG Company), whereupon the color difference ΔEa*b* was calculated by the following formula.

$$\Delta Ea^*b^* = \{(L1^*-L2^*)^2 + (a1^*-a2^*)^2 + (b1^*-b2^*)^2\}^{1/2}$$

Difference in Glossiness

The 60° glossiness of the support before coating the ink receiving layer and the 60° glossiness after the coating were measured by using a glossiness meter (Handy Glossiness Meter PG-1M, tradename, manufactured by Nippon Denshoku K.K.), whereupon the difference in glossiness was calculated by the following formula.

Difference in glossiness=|glossiness after the coating−glossiness of the support|

TABLE 2

| Example | Haze of the ink receiving layer | Color difference | 60° glossiness | | |
|---|---|---|---|---|---|
| | | | Support | After coating | Difference in glossiness |
| 1 | 5.5 | 2.1 | 25 | 40 | 15 |
| 3 | 4.8 | 1.9 | 25 | 46 | 21 |
| 5 | 5.5 | 1.7 | 6 | 45 | 39 |
| 10 | 34.2 | 2.4 | 6 | 9 | 3 |
| 11 | 81.2 | 5.6 | 25 | 4 | 21 |
| 12 | 3.2 | 1.4 | 25 | 29 | 4 |
| 15 | 3.4 | 1.2 | 25 | 48 | 23 |
| 16 | 3.3 | 1.1 | 25 | 47 | 22 |

The proofs and the regular printed products obtained in Evaluation 2 were compared under the following standards by the overall textures such as reproduction of colors, presentation of half tones, glossiness, sizzling appearance, metallic appearance and color fogging and visually determined. The proofs obtained from the recording media of Examples 1, 3, 10, 15 and 16 had textures very close to the regular printed products. In Example 5, the glossiness of the proof was large as compared with the regular printing, and the texture was slightly different. In Example 11, the printing performance was sufficient, but the texture of the paper was slightly low although it was a practical level. In Example 12, the ink receiving layer was thin, and the printing performance was slightly poor.

According to the present invention, it is possible to provide an easy method for preparing a printing proof which is close to a regular printed product with respect to the overall textures such as reproduction of colors, presentation of half tones, glossiness, sizzling appearance, metallic appearance and color foggings.

Further, according to the present invention, even if the same printing medium as used for regular printing is not used, if a sheet having substantially the same brightness and glossiness as the regular printing medium is used, a good printing proof is obtainable similarly, which is economically advantageous when the regular printing sheet for a large size product or works of art is an expensive material.

The entire disclosures of Japanese Patent Application No. 2000-113848 filed on Apr. 14, 2000, Japanese Patent Application No. 2000-125167 filed on Apr. 6, 2000 and Japanese Patent Application No. 2000-244949 filed on Aug. 11, 2000 including specifications, claims and summaries are incorporated herein by reference in their entireties.

What is claimed is:

1. A method for preparing a proof for plate printing, which comprises applying inkjet printing to an ink receiving layer of a recording medium to obtain a printing proof, wherein the recording medium comprises a support made of paper and said ink receiving layer is a separate layer from said support and formed on the surface of said support, and wherein said paper has a difference in brightness of at most 10% and a difference in glossiness (60°) of at most 20%, based on a plate printing paper.

2. The method for preparing a proof for plate printing according to claim 1, wherein the ink receiving layer is a porous ink receiving layer comprising a pigment and a binder.

3. The method for preparing a proof for plate printing according to claim 2, wherein the ink receiving layer has a haze of at most 40% and a thickness of from 5 to 100 µm.

4. The method for preparing a proof for plate printing according to claim 2, wherein the ink receiving layer has an average pore radius of from 3 to 25 nm and a pore volume of from 0.3 to 2.0 cm$^3$/g.

5. The method for preparing a proof for plate printing according to claim 1, wherein the ink receiving layer is a swellable ink receiving layer containing a water-soluble resin in an amount of at least 80 mass %.

6. The method for preparing a proof for plate printing according to claim 5, wherein the ink receiving layer has a haze of at most 40% and a thickness of from 5 to 100 µm.

7. The method for preparing a proof for plate printing according to claim 1, wherein the ink receiving layer has a haze of at most 40% and a thickness of from 5 to 100 µm.

8. The method for preparing a proof for plate printing according to claim 1, wherein the ink receiving layer is formed on the surface of the support by a process comprising coating said surface.

* * * * *